(12) United States Patent
Moto

(10) Patent No.: US 8,953,655 B2
(45) Date of Patent: Feb. 10, 2015

(54) OPTICAL TRANSMITTER SUPPRESSING EXCESS EMISSION OF LASER DIODE

(71) Applicant: Sumitomo Electric Industries, Ltd., Osaka (JP)

(72) Inventor: Akihiro Moto, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/074,487

(22) Filed: Nov. 7, 2013

(65) Prior Publication Data

US 2014/0126596 A1 May 8, 2014

(30) Foreign Application Priority Data

Nov. 7, 2012 (JP) ................................ 2012-245473

(51) Int. Cl.
*H01S 3/00* (2006.01)
*H01S 5/042* (2006.01)
*H01S 5/068* (2006.01)

(52) U.S. Cl.
CPC ............... *H01S 5/0427* (2013.01); *H01S 5/068* (2013.01)
USPC ................ 372/38.02; 372/29.01; 372/29.012; 372/29.015; 372/38.1; 372/38.04; 372/38.07

(58) Field of Classification Search
USPC ........ 372/29.01, 29.012, 29.015, 38.1, 38.02, 372/38.04
See application file for complete search history.

(56) References Cited

U.S. PATENT DOCUMENTS

| 8,009,709 | B2* | 8/2011 | Nelson .................... 372/38.02 |
| 2002/0139998 | A1* | 10/2002 | Dueme et al. ............. 257/200 |
| 2003/0002550 | A1* | 1/2003 | Schemmann et al. ..... 372/38.02 |
| 2008/0031634 | A1 | 2/2008 | Nguyen et al. |

FOREIGN PATENT DOCUMENTS

| JP | 2005-033019 A | 2/2005 |
| JP | 2007-266493 A | 10/2007 |
| JP | 2007-336217 A | 12/2007 |
| JP | 2009-272321 A | 11/2009 |

* cited by examiner

*Primary Examiner* — Dung Nguyen
(74) *Attorney, Agent, or Firm* — Venable LLP; Michael A. Sartori

(57) ABSTRACT

A laser diode (LD) driver to suppress the excess emission of an LD is disclosed. The LD driver has the shunt configuration with a driving transistor connected in parallel to the LD to shunt the bias current provided to the LD. The driver further provides a protection circuit to divide the bias current when the bias current is active but the driving transistor is turned off at an instant of the power on and off of the LD driver.

14 Claims, 4 Drawing Sheets

OPTICAL TRANSMITTER SUPPRESSING EXCESS EMISSION OF LASER DIODE

BACKGROUND OF THE INVENTION

1. Field of the Invention

The present application relates to an optical transmitter, in particular, the application relates to a circuit for driving a semiconductor laser diode (hereafter denoted as LD).

2. Related Background Art

One type of drivers for an LD has been known as, what is called, a shunt-driver. Various prior arts have disclosed the shunt-driver circuits. The shunt-driver absorbs a primary portion of the bias current supplied to the LD responding to a driving signal provided to an input of the driver. Thus, the bias current flowing in an LD connected to the output of the shunt-driver in a primary portion thereof is shunted to the driver as leaving a rest portion in the LD. Thus, the LD is modulated by the driving signal. In order to adjust average power and an extinction ratio of an optical output of the LD, the driver often controls an input bias level thereof.

However, an optical transmitter including the shunt-driver leaves a subject that, in the start of the operation, the activation of the bias current for the LD precedes the powering of the driver circuit. Under such a situation, the driver circuit absorbs no bias current; that is a whole bias current is supplied to the LD, which results in an excess emission of the LD. Also, at stopping the optical transmitter, the power-down of the driver circuit occasionally precedes the cut-off the bias current to the LD. In such a case, the whole the bias current instantaneously flows in the LD to cause the excess emission. The present application is to provide a technique to prevent such an excess emission of the LD.

SUMMARY OF THE INVENTION

An aspect of the present application relates to an optical transmitter that includes an LD, a bias current source, and an LD driver. The bias current source is connected in series to the LD between the second power supply and the ground, and powered by the second power supply. The LD driver includes first and second transistors each powered by the second power supply through the bias current source. The first transistor is made of n-type transistor, biased in the gate thereof by the first power supply, and powered by the second power supply through the bias current source. The first transistor drives the LD by dividing the first bypassing current from the bias current. The second transistor is made of p-type transistor, powered by the second power supply through the bias current source. The second transistor divides the second bypassing current from the bias current when the first power supply is inactive but the second power supply is active.

When only the second power supply is active, the bias current flowing in the LD causes a forward voltage Vf in the LD, which equivalently causes a drain bias Vds of the second transistor to generate the second bypassing current. Then, the bias current provided to the LD is decreased by the second bypassing current, by which the LD escapes from the state of the excess emission.

BRIEF DESCRIPTION OF THE DRAWINGS

The invention will be described in further detail with reference to the attached drawings in which.

DESCRIPTION OF THE PREFERRED EMBODIMENTS

Next, some embodiments will be described as referring to drawings. In the explanation of the drawings, numerals or symbols same or similar to each other will refer to elements same or similar to each other without overlapping explanations.

(First Embodiment)

Figure 1:
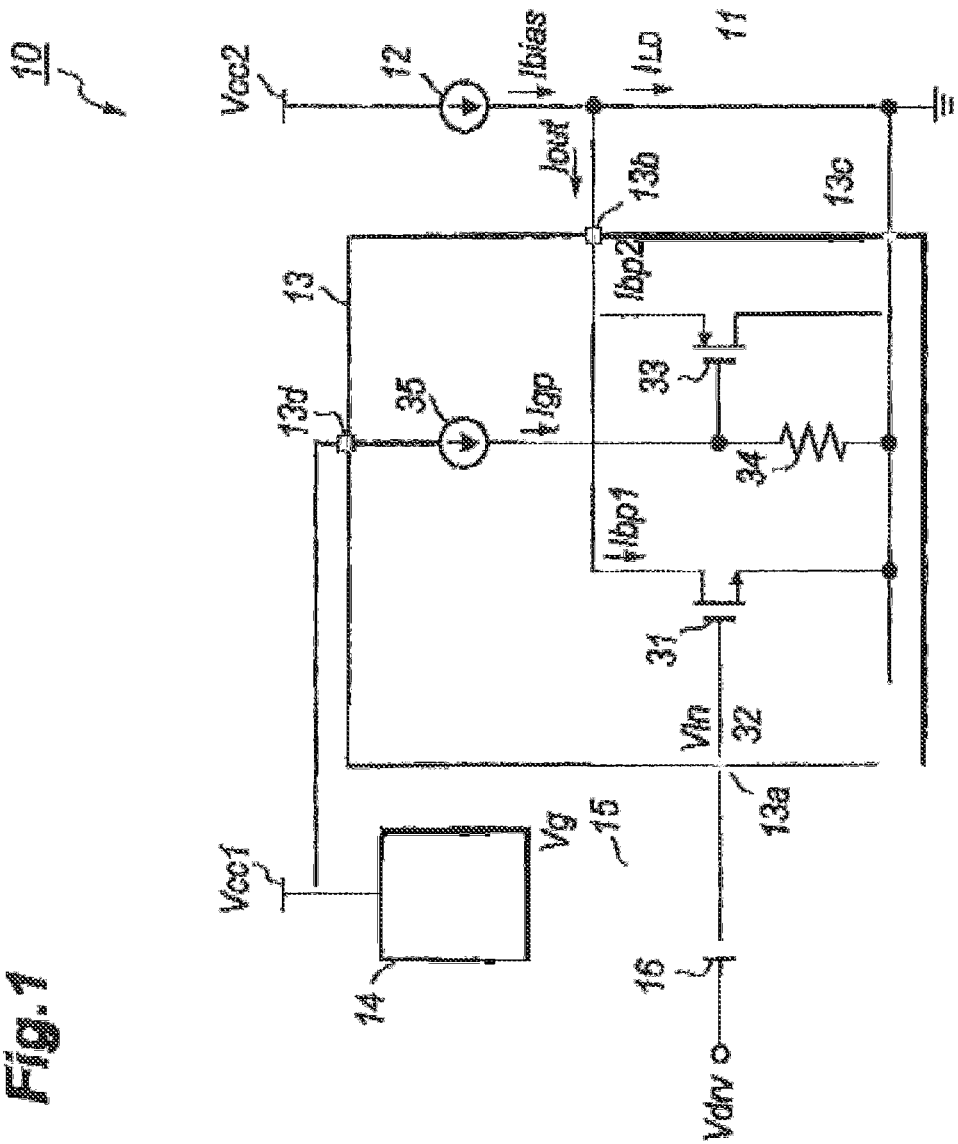
FIG. 1 is a circuit diagram of an optical transmitter according to an embodiment.

FIG. 1 shows a circuit diagram of an optical transmitter of the first embodiment. The optical transmitter 10, which is a type of what is called as the shunt-driver, primarily includes an LD 11, a first current source 12, a driver 13, a voltage source 14, an inductor 15, and a capacitor 16.

The LD 11, which is a type of semiconductor laser diode, generates an optical signal responding the driving current $I_{LD}$ provided thereto. An anode of the LD 11 couples with the first current source 12 and an output terminal 13b of the driver 13; while, a cathode thereof is directly connected to the ground GND. The LD 11 emits light provided with the driving current $I_{LD}$ derived from a bias current Ibias from the first current source 12, which generates a forward voltage Vf of about 1.3 V. The first current source 12 generates, powered by the second power supply Vcc2, the bias current Ibias to the LD 11, where the bias current Ibias is generally about 50 to 60 mA. The first current source 12 in the output thereof is connected to both of the anode of the LD 11 and the output 13b of the driver 13.

The driver 13 has a type of, what is called, the shunt-driver to drive the LD 11. The shunt-driver has a function that, shunting a portion of the bias current Ibias depending on an input signal Vin to the driver 13, which equivalently modulates the LD 11. The driver 13 provides the input terminal 13a, the output terminal 13b, the ground terminal 13c, and the power supply terminal 13d. The input terminal 13a, which is biased by the voltage source 14 through the inductor 15, receives the driving signal Vdrv through the capacitor 16. The output terminals 13b is, as already described; connected to the first current source 12 and the anode of the LD 11. The ground terminal 13c is grounded. The power supply terminal 13d receives the first power supply Vcc1.

The voltage source 14, which is powered by the first power supply Vcc1, generates a stabilized bias Vg to the input terminal 13a of the driver 13 through the inductor 15. The stabilized bias Vg is greater than a preset threshold Vth and typically about 0.8 V. The bias Vg gives a center value of the input signal Vdrv, which determines an average of the optical signal output from the LD 11 when the input signal has a mark ratio of 50%.

The inductor 15 is connected, in one of terminals thereof, to the output of the voltage source 14; while, the other terminal is connected to the input terminal 13a of the driver 13. The capacitor 16 is provided for coupling the input signal Vdrv with the driver 13 in AC mode. One of terminals of the capacitor 16 receives the input signal Vdrv; while, the other is connected to the inductor 15 and the input terminal 13a.

Details of the driver 13 will be described. The driver 13 includes two transistors, 31 and 33, two resistors, 32 and 34, and a current source 35, namely, the second current source.

One of the transistors, the first transistor 31, is a type of the n-MOSFET in the present embodiment. The first transistor 31 in the source thereof is grounded through the ground terminals 13c. The gate is connected to the input terminal 13a to receive the input signal Vin; while, the drain is connected to the output terminal 13b. The first transistor 31, responding the input signal Vin, shunts the first bypassing current Ibp1 from the bias current Ibias. That is, the first transistor 31 absorbs the first bypassing current Ibp1 in the drain to the source. Accordingly, the first transistor 31 is often called as a driving transistor powered by the second power supply Vcc2 through the first current source 12.

The resistor 32 operates as a terminator. Specifically, one terminal of the resistor 32 is connected to the gate of the first transistor 31, and the other terminal thereof is grounded. The resistor 32 preferably has resistance of 50Ω.

The other transistor 33, namely, the second transistor, operates as a protection circuit for the LD 11 from the excess emission. The second transistor 33 is a type of p-MOSFET and connected in parallel to the LD 11. The source of the second transistor 33 is coupled with the output terminal 13b, the drain thereof is grounded through the ground terminal 13c, and the gate is statically biased through the second current source 35 and the second resistor 34.

The second transistor 33 shunts the second bypassing current Ibp2 from the bias current Ibias depending on the forward voltage Vf of the LD 11 and the gate bias thereof. Specifically, when the source of the second transistor 33 becomes higher than the gate bias thereof by a preset amount; the second bypassing current Ibp2 flows in the second transistor 33 from the source to the drain. Moreover, the second transistor 33 has a gate width enough for flowing in a current to suppress the excess emission; specifically, the second transistor 33 is necessary to absorb a current of 20 to 30 mA at most. Accordingly, the second transistor 33 typically has the gate width of at least 90 μm.

The second resistor 34 operates as a voltage source. That is, one terminal of the resistor 34 is coupled with the gate of the second transistor 33 and the output of the second current source 35; while, the other terminal is grounded. The second resistor 34 has resistance of 10 to 20 kΩ. The second current source 35 provides to the second resistor 34 a constant current Igp of, for instance, 100 to 200 μA.

The second transistor 33, the second resistor 34, and the second current source 35 constitute a protection circuit for the excess emission of the LD 11. The second current source 35 and the second resistor 34 constitute a reference generator to generate a shut-off voltage, which corresponds to a voltage drop caused in the second resistor 34 by the current Igp coming from the second current source 35. The shut-off voltage is typically from 1.1 to 1.8 V.

Figure 2:
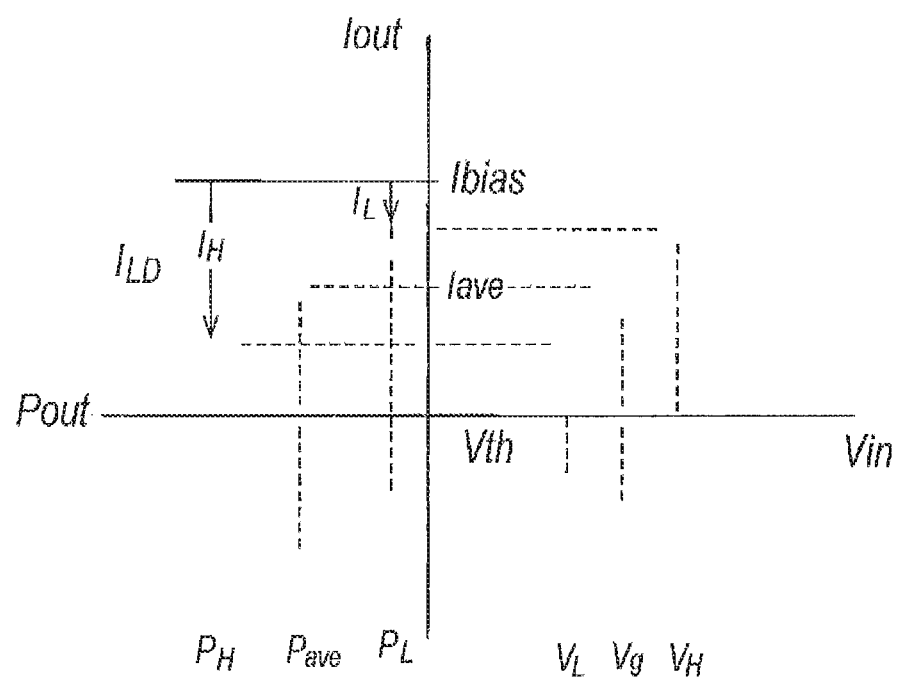
FIG. 2 schematically shows a relation of the optical output Pout to the input driving signal in the shunt driving configuration.

Next, the operation of the optical transmitter 10 will be described. FIG. 2 indicates a relation between the input signal Vin applied to the gate of the first transistor 31, the output current Iout of the driver 13, and the optical output Pout obtained from the LD 11 against the output current Iout of the driver 13. Under a normal operation where both power supplies, Vcc1 and Vcc2, are activated, the voltage source 14 biases the input terminal 13a by providing the static bias Vg thereto. Then, the first bypassing current Ibp1, whose magnitude Iave is typically 20 to 30 mA, flows into the drain of the first transistor 31. As already described, the first bypassing current Ibp1 is divided from the bias current Ibias and streamed into the driver 13 from the output terminal 13b. As a result, the LD 11 emits light with an average power Pave supplied with the driving current $I_{LD}$ which is subtracted from the bias current Ibias by the first bypassing current Ibp1.

Considering the driving signal Vdrv, the driving signals Vdrv provided through the coupling capacitor 16 is superposed on the static gate bias Vg. That is, referring to FIG. 2, the gate input Vin for the first transistor becomes the gate bias Vg in an average thereof with high and low levels, $V_H$ and $V_L$, respectively, where a difference $V_H - V_L$ becomes substantially equal to the magnitude of the driving signal Vdrv; the first bypassing current Ibp1 swings around the average Iave, which resultantly varies the driving current $I_{LD}$ for the LD 11 in a phase opposite to the driving signal Vdrv. That is, when the driving signal Vdrv is in LOW, the first bypassing current Ibp1 is in LOW, the driving current $I_{LD}$ is in HIGH $I_H$, and the output optical power Pout becomes in HIGH $P_H$. On the other hand, when the driving signal Vdrv is in HIGH $V_H$, the first bypassing current Ibp1 in HIGH, but the driving current $I_{LD}$ for the LD 11 is in LOW $I_L$, the optical output power Pout becomes in LOW $P_L$.

Considering the start-up of the optical transmitter 10, the first power supply Vcc1 occasionally staggers the operation thereof from that of the second power supply Vcc2 at the starting. For instance, the first power supply Vcc1 sometimes delays by a few milliseconds from the activation of the second power supply Vcc2 because the first power supply drives many capacitive loads. In such a case, the bias current Ibias is first supplied to the LD 11 from the second power supply Vcc2. At this instant, the voltage source 14 supplies no gate bias Vg because the first power supply Vcc1 is not activated yet; but the gate of the first transistor 31 is grounded through the first resistor 32, which turns off the first transistor 31. Then, no first bypassing current Ibp1 flows in the drain of the first transistor 31; accordingly, all bias current Ibias is provided to the LD 11 as the driving current $I_{LD}$.

The driving current $I_{LD}$ provided to the LD 11 generates a forward voltage Vf in the LD 11, which causes a bias $V_{DS}$ between the source and the drain, and the gate bias $V_{GS}$ between the gate and source of the second transistor 33; because the gate thereof is grounded through the second resistor 34 even the second current source 35 provides no current Igp, then a substantial gate bias $V_{GS}$ is applied to the second transistor 33. Thus, as the driving current $I_{LD}$ increases, the gate bias $V_{GS}$ of the second transistor 33 generates and increases the second bypassing current Ibp2, which is divided from the bias current Ibias to decrease the driving current $I_{LD}$. Accordingly, the second transistor 33, or the second bypassing current Ibp2, operates as the current feedback for the driving current $I_{LD}$ to prevent the LD 11 from being provided with an excess current.

Subsequently, activating the first power supply Vcc1, the voltage source 14 provides the gate bias Vg to the first transistor 31 to flow the first bypassing current Ibp1 in the drain thereof. Moreover, the second current source 35 begins to provide the current Igp to the second resistor 34 as the first power supply Vcc1 is activated, which increases the gate level thereof and equivalently decreases the gate bias $V_{GS}$ of the second transistor 33. Finally, the second transistor 33 turns off and the second bypassing current Ibp2 is cut off. The driving current $I_{LD}$ for LD 11 is simply determined by the bias current Ibias and the first bypassing current Ibp1.

The power-off sequence of the optical transmitter 10 will be explained. When the optical transmitter 10 is powered off, the second power supply Vcc2 sometimes causes a time lag of several microseconds to several milliseconds with respect to the turning off of the first power supply Vcc1 because, for instance, the first power supply Vcc1 connects many elements with low impedance as the load. In such a case, the first transistor 31 turns off because the gate thereof is grounded through the first resistor 32, and no drain current, namely, the first bypassing current Ibp1, flows into the drain of the first transistor 31.

Concurrently with the turning off of the first transistor 31, the second transistor 33 in the gate thereof is also grounded through the second resistor 34 because the second current source 35 provides no current Igp. However, the LD 11 is still provided with the driving current $I_{LD}$ because the second power supply Vcc2 delays the turning off thereof from that of the first power supply Vcc1 and the driving current $I_{LD}$ causes the forward voltage Vf in the LD 11, which generates a substantial source-drain bias in the second transistor 33. Thus, the second transistor 33, which is the p-type MOSFET in the embodiment, is provided with the source bias $V_{DS}$ and the gate bias $V_{GS}$; accordingly, the second transistor 33 flows a substantial current Ibp2 into the source thereof, which shunts the bias current Ibias and decreases the driving current $I_{LD}$. Thus, the LD 11 is protected from an excess current. Finally, the driving current $I_{LD}$ becomes zero as the second power supply Vcc2 turns off.

Figure 3:
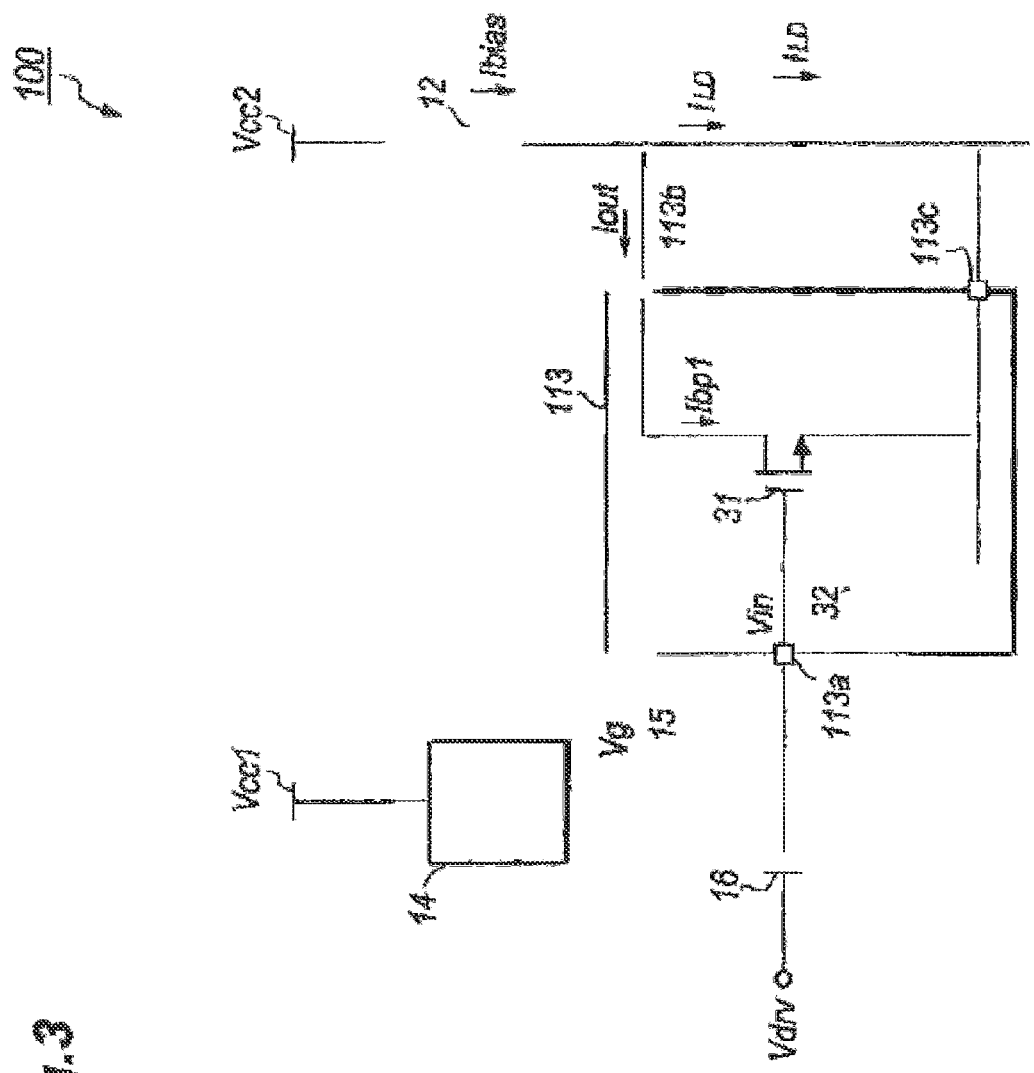
FIG. 3 is a circuit diagram of another optical transmitter comparable to the optical transmitter shown in FIG. 1.

FIG. 3 is a circuit diagram of an optical transmitter 100 comparable to the present embodiment shown in FIG. 1. The optical transmitter 100 has the type of the shunt-driver including the driver 113 instead of the driver 13. The driver 113 of the comparable example provides no protection circuit.

When two power supplies, Vcc1 and Vcc2, are both powered, the transmitter 100 operates substantially in a same manner as that of the aforementioned transmitter 10. On the other hand, when the transmitter is powered on and the first power supply Vcc1 delays the activation thereof from that of the second power supply Vcc2, the second power supply Vcc2 provides the bias current Ibias to the LD 11 without dividing the bypassing current Ibp1 from the bias current Ibias because the first power supply Vcc1 is not activated yet and the voltage source 14 provides no gate bias Vg to the gate of the first transistor 31, which still turns off the first transistor 31. Thus, the LD 11 is supplied with whole of the bias current Ibias as the driving current $I_{LD}$, which results in an excess emission of the LD 11.

Similarly, in a sequence where the transmitter 100 is powered off, the first power supply Vcc1 sometimes in the inactivation thereof precedes the second power supply Vcc2. In such a situation, the voltage source 14 provides no bias Vg to the gate of the transistor 31, which turns off the transistor 31 and no drain current flows therein. Then, whole of the bias current Ibias provided from the current source 12 is supplied to the LD 11 without being divided into the bypassing current Ibp1. Then, the LD 11 falls in the state of the excess emission.

Thus, the LD 11 is set in the state of the excess emission during the instant when the second power supply Vcc2 in the activation thereof precedes the activation of the first power supply Vcc1 and another instant when the first power supply Vcc1 turns off precedes the inactivation of the second power supply Vcc2; that is, the LD 11 falls in the state of the excess emission at the instant when only the second power supply Vcc2 is activated.

The optical transmitter 10 of the embodiment operates also supplied with two power supplies, Vcc1 and Vcc2, which causes the instant same with the comparable optical transmitter 100; that is, the instant when only the second power supply Vcc2 is activated. However, the driver 13 of the embodiment provides the protection circuit comprised of the second transistor 33 that absorbs the second bypassing current Ibp2 in the source thereof depending on the forward voltage Vf of the LD 11 generated by the driving current $I_{LD}$. The second bypassing current Ibp2 operates as the current feedback for the driving current $I_{LD}$. Accordingly, even when only the second power supply Vcc2 is activated, the driving current $I_{LD}$ is restricted by the second bypassing current Ibp2 and the LD 11 is protected from the state of the excess emission.

Moreover, the driver 13, exactly, the protection circuit provides the current source 35 and the second resistor 34 to determine the gate bias for the second transistor 33. Accordingly, after the first power supply Vcc1 is activated, the current source 35 provides the current Igp to the second resistor 34 to increase the gate level of the second transistor 33, which means that the gate bias $V_{GS}$ of the second transistor 33 decreases, which finally turns off the second transistor 33 under the normal operation and only the first bypassing current Ibp1 is divided from the bias current Ibias. Thus, the second bypassing current Ibp2 does not affect the normal operation of the optical transmitter 10.

(Second Embodiment)

Figure 4:
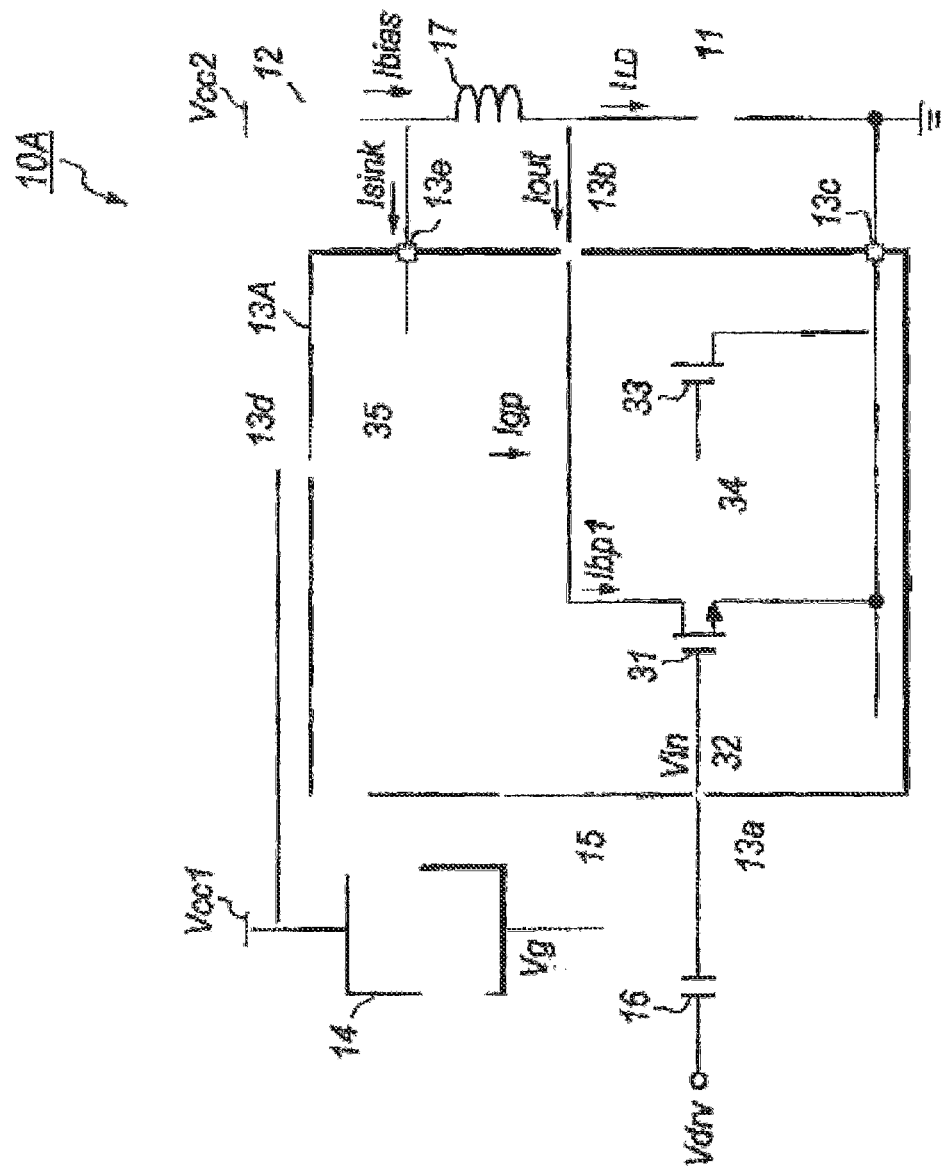
FIG. 4 is a circuit diagram of still another optical transmitter modified from that shown in FIG. 1.

FIG. 4 is a circuit diagram of another optical transmitter 10A having distinguishable features of providing a driver 13A modified from the aforementioned driver 13 and an inductor 17 connected in series to the LD 11.

The inductor 17 is put between the first current source 12 and the LD 11; while, the modified driver 13A provides a current terminal 13e. That is, the driver 13A provides the second transistor 33 type of the p-MOSFET whose source is connected to the current terminal 13e not the output terminal 13b as that of the first embodiment. The output terminal 13b of the driver 13 is connected to the anode of the LD 11 and a downstream terminal of the inductor 17; while, the current terminal 13e is connected to an upstream terminal of the inductor 17. That is, the inductor 17 is put between the current terminal 13e and the output terminal 13b of the driver 13.

The operation of the optical transmitter 10A is the same with that of the aforementioned optical transmitter 10. The driver 13A extracts the first bypassing current Ibp1 from the bias current Ibias as the output current Iout under the normal operation of the transmitter 10A. While, the driver 13A extracts the sink current Isink from the bias current Ibias at the instant only the second power supply Vcc2 is activated. Specifically, when the second power supply Vcc2 is activated but the first power supply Vcc1 is substantially killed, no first bypassing current Ibp1 is divided from the bias current Ibias and the whole bias current Ibias flows into the LD 11, which causes the forward voltage Vf in the LD 11. The forward voltage Vf becomes the source-drain bias of the second transistor 33 but the gate thereof is grounded, which causes a substantial gate bias $V_{GS}$ in the second transistor 33 and the source current, namely, the sink current Isink is divided from the bias current Ibias. Thus, the state where the whole bias current Ibias flows into the LD 11 is prevented.

When the drain of the first transistor 31 and the source of the second transistor 33 are commonly connected to the output terminal 13b as the arrangement of the first embodiment, stray capacitors Cgs of the second transistor 33 between the gate and the source and that Css of the second transistor 33 between the source and the substrate possibly degrade high frequency responses of the first transistor 31 because the first bypassing current Ibp1 is modulated by the driving signal Vdrv whose frequency often reaches and sometimes exceeds 10 Gbps. The driver 13A of the second embodiment provides the current terminal to absorb the second bypassing current Ibp2, in other words, the second transistor 33 in the source thereof is not connected to the output terminal 13b. Moreover, the modified transmitter 13A provides the inductor 17 between the output terminal 13b and the current terminal 13e. Thus, the modified optical transmitter 13A isolates the second transistor 33 from the first transistor 31. Thus, the high frequency performance of the first transistor 31 is not affected from the existence of the second transistor 33.

In the foregoing detailed description, the circuits have been described with reference to specific exemplary embodiments thereof. It will, however, be evident that various modifications and changes may be made thereto without departing from the broader spirit and scope of the present invention. For instance, the embodiments provide transistors, 31 and 33, type of MOSFET. However, the embodiments only require that the first transistor is the n-type while, the second transistor is the p-type. Thus, an npn-type bipolar transistor and/or an n-type field effect transistor (n-FET) are applicable as the first transistor, while, a pnp-type bipolar transistor and/or a p-type FET are applicable to the second transistor. Also, the embodiments provide the first current source 12 to provide the bias current Ibias to the LD 11. However, the first current source 12 is replaceable to an inductor. That is, the LD 11 is biased by the first power supply Vcc1 through the inductor. Accordingly, the present specification and figures are to be regarded as illustrative rather than restrictive.

What is claimed is:

1. An optical transmitter, comprising:
   a laser diode (LD);
   a bias current source configured to provide a bias current to the LD, the bias current source being powered by a second power supply; and
   an LD driver including,
      a first transistor made of n-type transistor, biased by a first power supply, and powered by the second power supply, the first transistor driving the LD by dividing a first bypassing current from the bias current, and
      a second transistor made of p-type transistor and powered by the second power supply, the second transistor dividing a second bypassing current from the bias current when the first power supply is inactive and the second power supply is active.

2. The optical transmitter of claim 1,
   wherein the first transistor and the second transistor are commonly connected in an upstream current terminal thereof to the bias current source, and grounded in a downstream current terminal.

3. The optical transmitter of claim 1,
   wherein the first transistor is connected in an upstream current terminal thereof to the bias current source through an inductor, and the second transistor is connected in an upstream current terminal thereof directly to the bias current source.

4. The optical transmitter of claim 1,
   wherein the LD driver further includes a current source and a resistor connected in series to the current source between the first power supply and a ground, the resistor causing a gate bias for the second transistor by a current provided from the current source.

5. The optical transmitter of claim 4,
   wherein the second transistor is turned off when the first power supply is activated.

6. The optical transmitter of claim 1,
   wherein the first transistor is one of an n-MOSFET, an npn transistor and an n-type filed effect transistor (FET), and the second transistor is one of a p-MOSFET, a pnp transistor, and a p-type FET.

7. The optical transmitter of claim 1,
   wherein the first transistor is biased in a gate thereof by a voltage source powered by the first power supply.

8. An optical transmitter, comprising:
   first and second power supplies;
   a laser diode (LD) connected between the second power supply and the ground;
   a first transistor driven by a driving signal and biased by the first power supply, the first transistor being connected in parallel to the LD to divide a first bypassing current from a bias current provided from the second power supply to the LD, the LD being provided with a driving current subtracted by the first bypassing current from the bias current when the first and second power supplies are active; and
   a second transistor configured to generate a second bypassing current, the LD being driven by the driving current subtracted by the second bypassing current from the bias current when the second power supply is active but the first power supply is inactive.

9. The optical transmitter of claim 8,
   further including a current source and a resistor connected in series to the current source between the first power supply and a ground,
   wherein the second transistor in a gate thereof is grounded through the resistor when the first power supply is inactive and biased by a voltage caused by a current provided from the current source and flowing in the resistor.

10. The optical transmitter of claim 8,
    wherein the second transistor has a type opposite to a type of the first transistor.

11. The optical transmitter of claim 10,
    wherein the second transistor is one of a p-type MOSFET, a pnp bipolar transistor, and a p-type field effect transistor (FET), and the first transistor is one of an n-type MOSFET, an npn bipolar transistor, and an n-type FET.

12. The optical transmitter of claim 8,
    wherein the LD is provided with the bias current from the second power supply through a bias current source.

13. The optical transmitter of claim 8,
    wherein the LD is provided is the bias current through an inductor.

14. The optical transmitter of claim 13,
    wherein the first transistor is powered by the second power supply through the inductor and the second transistor is powered directly by the second power supply.

* * * * *